United States Patent [19]
Ezell

[11] Patent Number: 5,913,181
[45] Date of Patent: *Jun. 15, 1999

[54] CIRCUIT FOR PROVIDING A SWITCH SIGNAL TO TRIGGER CHANGER IN A DIGITAL POTENTIOMETER

[75] Inventor: Richard William Ezell, Carrollton, Tex.

[73] Assignee: Dallas Semiconductor Corp., Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/497,301

[22] Filed: Jun. 30, 1995

[51] Int. Cl.$^6$ ................................................. G05B 24/02
[52] U.S. Cl. .............................. 702/65; 702/64; 330/273; 330/252; 330/254; 330/253; 330/261; 327/65; 327/63
[58] Field of Search ................................. 369/59; 327/65, 327/530, 534, 361, 352; 323/237, 322, 354; 318/268, 599; 360/27; 331/1 A; 381/106; 330/252, 254, 257, 261, 282, 284, 273; 702/65, 64

[56] References Cited

U.S. PATENT DOCUMENTS

| | | | |
|---|---|---|---|
| 3,831,160 | 8/1974 | Cronin et al. | 340/256 |
| 3,986,131 | 10/1976 | Ross et al. | 330/273 |
| 4,148,078 | 4/1979 | Riddle, Jr. | 360/27 |
| 4,260,947 | 4/1981 | Massey | 323/322 |
| 4,514,703 | 4/1985 | Maher et al. | 330/279 |
| 4,567,425 | 1/1986 | Bloomer | 323/237 |
| 4,680,490 | 7/1987 | Baker et al. | 307/575 |
| 4,873,618 | 10/1989 | Frederick et al. | 363/17 |
| 5,124,968 | 6/1992 | Kobayashi | 369/59 |
| 5,208,842 | 5/1993 | Atwood et al. | 377/55 |
| 5,243,535 | 9/1993 | Bolan et al. | 702/65 |
| 5,252,902 | 10/1993 | Uehara et al. | 318/599 |
| 5,354,971 | 10/1994 | Chen | 219/661 |
| 5,357,155 | 10/1994 | Wile | 327/361 |
| 5,365,505 | 11/1994 | Fuji | 369/59 |
| 5,554,943 | 9/1996 | Moreland | 327/65 |
| 5,557,548 | 9/1996 | Gover et al. | 364/551.01 |

OTHER PUBLICATIONS

National Semiconductor, "LM160/LM360 High Speed Differential Comparator", National Operational Amplifiers Databook, pp. 3–54 to 3–57, 1995.

Hnatek, "Design of Solid–State Power Supplies", 2nd edition, Van Nostrand Reinhold Co. pp. 126–133, 1981.

Van Nostrand's Scientific Encyclopedia 6th edition, publisher Van Nostrand Reinhold, p. 735, 1983.

Joseph N. Babanezhad, "A Rail–to–Rail CMOS Op Amp," IEEE Journal of Solid–State Circuits, vol. 23, No. 6, Dec. 1988, pp. 1414–1417.

Johan H. Huijsing and Daniel Linebarger, "Low–Voltage Operational Amplifier with Rail–to–Rail Input and Output Ranges," IEEE Journal of Solid–State Circuits, vol. sc–20, No. 6, Dec. 1985, pp. 1144–1150.

*Primary Examiner*—James P. Trammell
*Assistant Examiner*—Cuong H. Nguyen
*Attorney, Agent, or Firm*—Jenkens & Gilchrist

[57] ABSTRACT

A comparator which for example can be used for a digital potentiometer is shown. Specifically, a dual differential input circuit with a push/pull amplifier at the output stage is disclosed wherein a crossing is detected in an inputted signal as the crossing occurs and wherein the push/pull amplifier pair at the output stage provides very fast detection of a crossing. This is particularly useful in acting as a trigger mechanism for changes in a digital potentiometer for example to elements noise caused as "wiper changes" occur.

14 Claims, 2 Drawing Sheets

CIRCUIT FOR PROVIDING A SWITCH SIGNAL TO TRIGGER CHANGER IN A DIGITAL POTENTIOMETER

BACKGROUND OF THE INVENTION

1. Technical Field of the Invention

The present invention relates to analog integrated circuits, and, more particularly, to an integrated circuit which provides a selectable potential between two external terminals.

2. Description of Related Art

Traditional potentiometers are mechanical devices whose resistance varies according to a selected physical position of a wiper, which produces selected electrical potentials. Typically, wiper location is controlled by rotating or sliding the wiper to the desired position. The increased use of integrated circuits and other semiconductor devices includes efforts to develop solid state potentiometers. For example, Xicor's X9MME, discussed in U.S. Pat. No. 5,243,535, a resistor array composed of 99 resistive elements is disclosed wherein the wiper position is digitally controllable. Another example is provided in Banezhad and Gregorian, "A Programmable Gain/Loss Circuit," 22 IEEE Journal of Solid-State Circuits 1082 (1987), a programmable circuit which provides gain/loss values ranging from −25.5dB to +25.5dB in fixed 0.1dB increments. Other devices, perhaps more properly named attenuators, have been developed to provide nonlinear steps to simulate a rising or falling of a resistance value.

One notable aspect of the design in these references, is that they utilize conventional integrated circuit manufacturing techniques. With respect to resistor arrays, it is known that resistance matching between two discrete devices is best accomplished, at the design stage, by designing and building cells of resistors having resistors using equal values and/or equal numbers of resistors. In order to obtain a target resistance, the interconnections between cells can be varied to create the target resistance.

Thus, a desired resistance for a resistance cell of a digital potentiometer is only obtained through random good fortune, especially for lower values of resistance.

Ordinarily, the resulting resistance is only within a variable tolerance range of the desired resistance. For example, in prior art devices a typical tolerance can be in the range of ±15% but match to each other with much tighter tolerances, as high as fractions of a percent. Thus, the traditional design approaches to developing these resistor banks and/or digital potentiometers lend themselves to repetitively yielding high levels of precision only on exactly repeated resistances. However, it is generally known that even the smallest steps (dB) in attenuators do not provide the required resolution to mimic a smoothly changing resistance needed to produce nonlinear steps. These attenuators cause or introduce gain distortions that are only marginally tolerable at audio frequencies. These distortions become unsuitable when precise resistances are required, especially at low values of resistance such as on the order of below 100 ohms. The prior art, does not, therefore, appear to provide a solution for a digital potentiometer requiring precise, small, logarithmic steps.

In addition to not providing precise resistance values, digital potentiometers have other shortcomings. First, at the front end, most of the prior art digital potentiometers do not have the capability of directly connecting to a switch on a panel, for example of a stereo. While mechanical potentiometers are generally mounted directly to a stereo panel, it is common to interface a digital potentiometer to a switch or switches through a microprocessor which may be under software control. Using this approach, when a volume increase is selected, digital potentiometers may frequently introduce detectable noise, especially in the form of clicks into the signal as different wiper points are selected while a given signal is being amplified.

The problem of clicking sounds resulting from noise being introduced or added to the signal being amplified has been addressed by several prior art references. Some have attempted to solve the problem by providing an active filter to "purify" the signal. Other approaches have also been suggested depending upon the perceived problem.

However the problem which has not been identified in the prior art is that the change from one wiper point to another, in a digital potentiometer, occurs while a given signal is being amplified. Thus, there is a need for a circuit for controlling and effecting any changes in wiper positions only when there is no input signal, or when the input terminals are equal; a circuit which synchronizes wiper position changes to correspond with a crossing of the signal which is being amplified solves the prior art problems.

Digital potentiometers which may be directly attached to a switch as a mechanical potentiometer, which reduce the noise added to a signal during changes in amplification, which provide accurate and predictable attenuation in logarithmic increments to account for human hearing sensitivity, and which consume less power to operate are needed.

SUMMARY OF THE INVENTION

The present invention is directed to a digital potentiometer having a control circuit capable of effectuating what is analogous to a wiper position change substantially at the crossing of a signal to reduce or eliminate the introduction of noise to the amplified signal resulting from wiper changes. In this context the term wiper change refers to the electronic connection and/or disconnection of cells of resistive values to an output or wiper. A further example of this concept can be found in a concurrently filed U.S. patent application of Ezell, entitled Logarithmic Taper Resistor, Ser. No. 08/497,485, which is incorporated by reference herein. More particularly, the present invention is directed to a control circuit which effectuates wiper changes very quickly after a crossing and which is capable of effectuating such a change for either an increasing or decreasing signal when such signal has a crossing.

To achieve this capability, this invention uses a dual differential input comparator adapted for reacting to different signal common-mode ranges. This comparator also has an output stage which contains a rapidly reacting push/pull amplifier which sums the signals from the two differential inputs and which switches out a part of the circuit to avoid the introduction of error if the input signal to the comparator is out of the common-mode range for that side of the circuit.

In order to accomplish crossing detection over a wide range of input signal bias values, a circuit having at least two comparators with a wide input common mode are used. Specifically, two differential amplifier pairs, namely a PMOS pair and an NMOS pair, are summed through a series of current mirrors produce a single output. The current mirrors at the output stage are adapted for extremely fast operation with minimal and negligent propagation delays and produce a signal indicative of a crossing.

BRIEF DESCRIPTION OF THE DRAWINGS

Other advantages and novel features of the present invention will become apparent from the following detailed description of the invention when considered in conjunction with the accompanying drawings in which.

DETAILED DESCRIPTION OF THE PRESENTLY PREFERRED EXEMPLARY EMBODIMENTS

Figure 1:
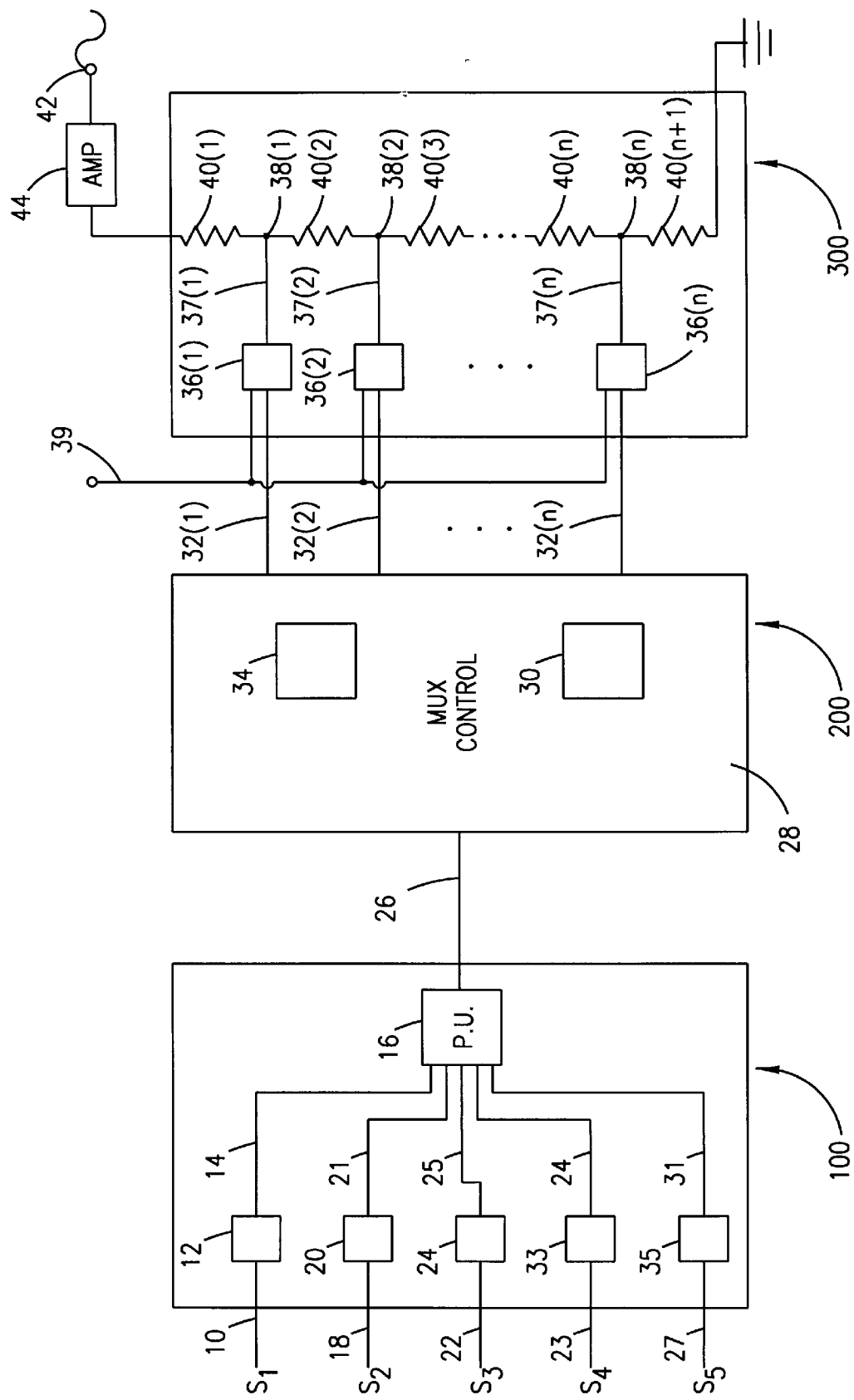
FIG. 1 is a block diagram demonstrating a system overview comprising the invention.

Referring now to FIG. 1 there is shown a block diagram of the system comprising the invention. Depicted in FIG. 1 is a series of blocks all forming a part of a digital potentiometer. As may be seen, block 100, which contains circuitry adapted for communicating with external switches, is connected to block 200 which contains circuitry for controlling the multiplexers of block 300 which, in turn, interface with the resistor chain of the potentiometer and its output. Thus, a digital potentiometer which is fully capable of being directly connected between external switches and an amplifier is disclosed herein. A further more detailed description of the generalized operation of the digital potentiometer found in the aforementioned, concurrently filed patent application, for which the full description and operation are incorporated by reference herein.

Figure 2:
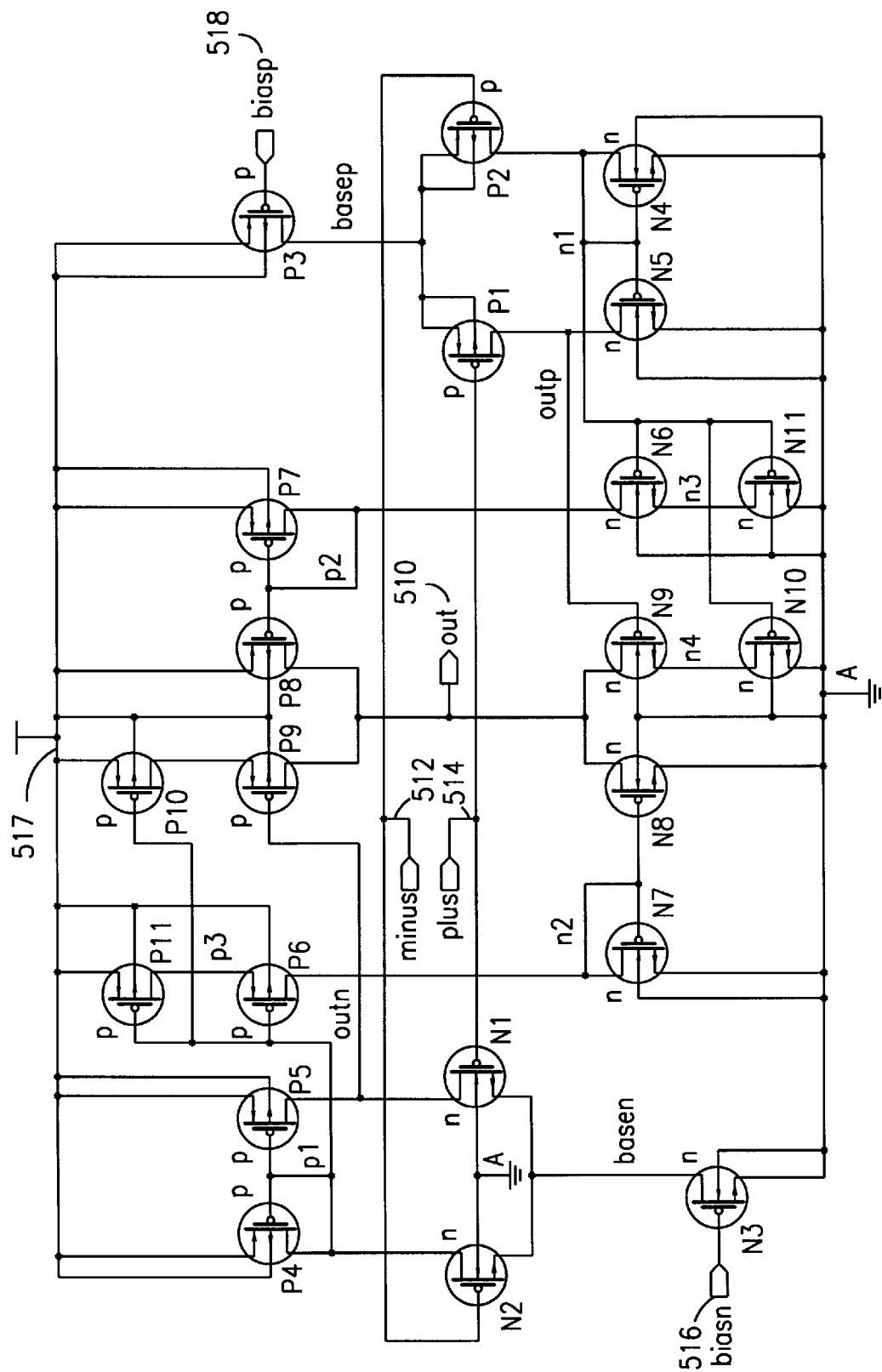
FIG. 2 is a schematic demonstrating one embodiment of the invention.

Referring now to FIG. 2, a schematic diagram representing one embodiment of the crossing circuit, is shown a circuit having two differential inputs 512, 514, two biasing inputs 516, 518, and an output 510. While one skilled in the art may generally appreciate the various stages of the circuit shown in FIG. 2, the following discussion is helpful in identifying the functionality of the circuit. Specifically an edge or change in potential is generated at the output 510 every time a signal at the minus input 512 equals the signal at the plus input 514, thereby indicating a crossing. Thus the edge is used if there is to be a wiper change as the trigger. To achieve this result, however, the signal input at the minus input 512 must equal the signal input at the plus input 514 and at the corresponding input sides of the circuit must be in and ON state. To illustrate, if the input at the minus input 512 is greater than a voltage of an N-channel threshold, by way of example, one volt, then N2 is activated which therefore results in the activation of P4, P6, P11, P10, and therefore P9, the FET which produces the output for one side of the circuit. Similarly, if the input at the minus input 512 is less than the threshold turn on voltage for a P-channel transistor, for example, if Vcc at line 517 is equal to 3 volts and the threshold voltage is equal to 1 volt, then a P-channel transistor is activated at a voltage below 2 volts. Thus, P2 is activated which in turn activates N4, N6, N11, N10 and N9, the FET providing an output signal for the other side of the circuit. In this embodiment, therefore, the comparator will work so long as at least one side of the circuit is activated, a case that always exists. Thus, this comparator is capable of operating from rail to rail.

It is important to note that the output stage of the circuit has a dual push/pull amplifier pair. Thus, it is the combination of this dual push/pull amplifier pair and the remainder of the circuit which provide extremely fast response and crossing detection. This crossing is then used as a control signal for triggering changes in the resistance network if a resistance change has been called for by the multiplexer control of FIG. 1. By providing this trigger signal at the time of a crossing, any noise produced by a change in wiper position of the resistive network can be eliminated. Although, this crossing technique and circuit is used with the aforementioned resistive system of the copending application, this technique and circuit can be used with other types of automated resistive networks by using the zero-cross signal to drive or act as a trigger for the selection mechanism.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A circuit for providing a switch signal to trigger changes in a digital potentiometer, said circuit comprising:
    a dual differential input including a first input for receiving a first signal and a second input for receiving a second signal;
    said dual differential input further including a second transistor connected to said first input, and including a third and fourth transistor connected to said second input;
    a first bias input coupled to said first transistor of said first input and further coupled to said third transistor of said second input, said first bias input for receiving a second biasing signal;
    a second bias input coupled to said second transistor of said first input and further coupled to said fourth transistor of said second input, said second bias input for receiving a second biasing signal;
    a first means, coupled to said dual differential input, for detecting when said first signal is equal to said second signal; and
    a second means, responsive to said first means detecting when said first signal is equal to said second signal, for providing the switch signal to trigger changes in the digital potentiometer.

2. The circuit as recited in claim 1, wherein said second means includes a dual push/pull amplifier pair.

3. The circuit as recited in claim 1, wherein said first transistor is an N-channel MOSFET and said second transistor is a P-channel MOSFET.

4. The circuit as recited in claim 3, wherein said N-channel MOSFET includes a gate and said P-channel MOSFET includes a gate, with said first input connected to said gate of said N-channel MOSFET and connected to said gate of said P-channel MOSFET.

5. The circuit as recited in claim 1, wherein said third transistor in is an N-channel MOSFET and said fourth transistor is a P-channel MOSFET.

6. The circuit as recited in claim 5, wherein said N-channel MOSFET includes a gate and said P-channel MOSFET includes a gate, with said second input connected to said gate of said N-channel MOSFET and connected to said gate of said P-channel MOSFET.

7. The circuits as recited in claim 1, wherein said first and third transistors are N-channel MOSFETs and said second and fourth transistors are P-channel MOSFETs.

8. The circuit as recited in claims 7, wherein each of said N-channel MOSFETs include a gate and each of said P-channel MOSFETs include a gate, with said first input connected to each of said gates of said first and second transistors, and said second input connected to each of said gates of said third and fourth transistors.

9. A circuit for providing a switch signal to trigger changes in a digital potentiometer, said circuit comprising:

a dual differential input including a first input for receiving a first signal and a second input for receiving a second signal;

said dual differential input further including a first and second transistor connected to said first input, and including a third and fourth transistor connected to said second input;

a first bias input coupled to said first transistor of said first input and further coupled to said third transistor of said second input, said first bias input for receiving a first biasing signal;

a second bias input coupled to said second transistor of said first input and further coupled to said fourth transistor of said second input, said second bias input for receiving a second biasing signal;

a crossing detector coupled to said dual differential input, said crossing detector for detecting when said first signal is equal to said second signal; and a first means, responsive to said crossing detector detecting when said first signal is equal to said second signal, for providing the switch signal to trigger changes in the digital potentiometer.

10. The circuit as recited in claim 9, wherein said first transistor is an N-channel MOSFET and said second transistor is a P-channel MOSFET.

11. The circuit as recited in claim 10, wherein said N-channel MOSFET includes a gate and said P-channel MOSFET includes a gate, with said first input connected to said gate of said N-channel MOSFET and connected to said gate of said P-channel MOSFET.

12. The circuit as recited in claim 9, wherein said third transistor in is an N-channel MOSFET and said fourth transistor is a P-channel MOSFET.

13. The circuit as recited in claim 9, wherein said first means includes a dual push/pull amplifier pair.

14. The circuit as recited in claim 12, wherein said N-channel MOSFET includes a gate and said P-channel MOSFET includes a gate, with said second input connected to said gate of said N-channel MOSFET and connected to said gate of said P-channel MOSFET.

* * * * *

UNITED STATES PATENT AND TRADEMARK OFFICE
CERTIFICATE OF CORRECTION

| | |
|---|---|
| PATENT NO. | : 5,913,181 |
| APPLICATION NO. | : 08/497301 |
| DATED | : June 15, 1999 |
| INVENTOR(S) | : Ezell |

It is certified that error appears in the above-identified patent and that said Letters Patent is hereby corrected as shown below:

Column 4, line 20   Before "second"
Insert --first and--

Column 4, line 26   Replace the second occurrence of "second"
With --first--

Column 4, line 50   Replace "in is"
With --is--

Signed and Sealed this

Thirty-first Day of July, 2007

JON W. DUDAS
*Director of the United States Patent and Trademark Office*